United States Patent [19]
Driller et al.

[11] Patent Number: 4,721,908
[45] Date of Patent: Jan. 26, 1988

[54] APPARATUS FOR ELECTRONICALLY TESTING PRINTED CIRUCIT BOARDS OR THE LIKE

[75] Inventors: Hubert Driller; Edmund Krause; Paul Mang, all of Schmitten, Fed. Rep. of Germany

[73] Assignee: Mania Elektronik Automatisation Entwicklung und Gerätebau GmbH, Schmitten, Fed. Rep. of Germany

[21] Appl. No.: 886,639

[22] Filed: Jul. 15, 1986

[30] Foreign Application Priority Data

Sep. 16, 1985 [EP] European Pat. Off. ........ 85111700.2

[51] Int. Cl.⁴ .............................................. G01R 1/06
[52] U.S. Cl. ............................ 324/158 F; 324/158 P; 324/73 PC
[58] Field of Search .............. 324/73 PC, 72.5, 158 P, 324/158 F; 339/108 TP, 117 P, 117 R

[56] References Cited

U.S. PATENT DOCUMENTS

| | | | |
|---|---|---|---|
| 3,899,233 | 8/1975 | Sigel et al. | 324/72.5 |
| 3,906,363 | 9/1975 | Fowler | 324/73 PC |
| 4,061,969 | 12/1977 | Dean | 324/73 PC |
| 4,230,985 | 10/1980 | Matrone et al. | 324/73 PC |
| 4,322,682 | 3/1982 | Schadwill | 324/158 P |
| 4,423,373 | 12/1983 | Le Croy, Jr. | 324/73 PC |
| 4,463,310 | 7/1984 | Whitley | 324/73 PC |
| 4,544,886 | 10/1985 | Murray et al. | 324/73 PC |
| 4,618,820 | 10/1986 | Salvagno et al. | 324/73 PC |

FOREIGN PATENT DOCUMENTS

| | | |
|---|---|---|
| 2933682 | 6/1980 | Fed. Rep. of Germany . |
| 2915742 | 10/1980 | Fed. Rep. of Germany ... 324/158 P |
| 2933862 | 3/1981 | Fed. Rep. of Germany ... 324/73 PC |
| 0197477 | 12/1982 | Japan ........................... 324/158 F |
| WO83/01688 | 5/1983 | PCT Int'l Appl. ............. 324/158 P |
| 2139019 | 10/1984 | United Kingdom ........... 324/158 F |

OTHER PUBLICATIONS

"Multiprobe Testing Device", by Eddy, IBM Tech. Disc. Bull., vol. 12, #4, 9/69, p. 539.
"Test Chamber with Seal and Boot", by Bruder et al., IBM Tech. Disc. Bull., vol 17, #1, 6/74, pp. 92–93.

Primary Examiner—Reinhard J. Eisenzopf
Assistant Examiner—W. Burns
Attorney, Agent, or Firm—Wenderoth, Lind & Ponack

[57] ABSTRACT

An apparatus for electronically testing printed circuit boards or the like includes a plurality of substantially parallel test pins for making electrical contact between resilient contact elements in an array plate or the like and contact areas on a printed circuit board. A mask plate extends at right angles to the test pins and has through-bores through which the test pins extend in a manner such that one end of each test pin projects therethrough to engage a respective contact area of a circuit board placed in a testing position. Spaced from the mask plate is an elastic plate which is substantially parallel to the mask plate and which receives test pins, which are non-yielding or rigid longitudinally, in a manner such that such pins are retained in the elastic plate due to the elasticity of the material thereof.

19 Claims, 6 Drawing Figures

APPARATUS FOR ELECTRONICALLY TESTING PRINTED CIRUCIT BOARDS OR THE LIKE

BACKGROUND OF THE INVENTION

The present invention relates to an apparatus for electronically testing printed circuit boards or the like. Specifically, the present invention is directed to such an apparatus of the type including a plurality of substantially parallel test pins for making electrical contacts between respective contact areas of a printed circuit board or the like to be tested and respective of a plurality of resilient contact elements disposed in accordance with a grid of an array plate or the like against which the apparatus is urged, and a mask plate extending at right angles to the test pins and having therein through-bores through which extend the test pins. First ends or tips of the test pins project through the through-bores in the mask plate to engage the contact areas of the printed circuit board.

West German Laid-Open Application (DE-OS) No. 29 33 862 discloses apparatus or an adaptor for electronically testing printed circuit boards and including resilient testing pins to make electric contact between a contact array on a basic grid and a printed circuit board urged onto such apparatus. Each test pin has one tip thereof opposite the contact array to engage a guide channel of the apparatus having the contact array mounted therein and engages in the guide channel a rigid contact element connected through leads to electronic testing means. At its end opposite the printed circuit board under test each test pin has a longitudinally resilient contact tip to engage a through-connected pad on the printed circuit board urged toward the apparatus so as to make electrical contact with such pad.

One shortcoming of test pins of this nature is that the axially resilient contact tips thereof render them relatively complicated and expensive. Also, the diameter of such test pin is relatively great in the area of the resilient contact tip. This may be a major inconvenience due to the ever increasing complexity and packing density of printed circuit boards, which may exhibit local connection pad densities in excess of the average contact density on the basic grid of the contact array. Due to the relatively great diameter of the test pins in the area of the resilient contact tips, adaptation to increasing pad densities no longer will be possible.

There also has been known structure or an adaptor in which the individual test pins do not have resilient contact tips and in which the individual contact elements of the grid-aligned contact array instead are resilient in nature. One shortcoming of this approach is that the springless test pins have to be contoured so as to enable them to be retained longitudinally in the apparatus. Such contour may be obtained, for example, by increasing the diameter of the test pin tips in predetermined portions thereof. This measure limits the possibility of adapting the overall structure to higher pad densities towards the edges of the printed circuit boards. On the other hand, such contour may be obtained also by reducing the test pin tip diameter in certain portions thereof. In that case, however, the stability of the test pin tips will suffer.

SUMMARY OF THE INVENTION

In view of the above, it is an object of the present invention to provide apparatus of the above described type which is capable of employing springless and uncontoured test pins.

It is a further object of the present invention to provide such an apparatus whereby the test pins may be maintained in position in the apparatus in a novel manner.

These and other advantages of the present invention are achieved by the provision that the test pins are longitudinally rigid, and of an elastic plate spaced from and parallel to the mask plate, the test pins extending through the elastic plate in a manner such that they are retained therein due to the intrinsic elasticity of the material of the elastic plate.

One essential advantage of the invention is that it enables springless and uncontoured or rigid test pins to be used. The cost of manufacturing such rigid pins is about 90 to 95% lower than the cost of making resilient test pins and about 70% lower than the cost of manufacturing contoured rigid pins.

Also, as the cost of making the test pins is very low, the invention advantageously makes it possible to store in an economical manner apparatus or adaptors of the inventive type which has or have been configured for particular printed circuit board layouts. Once assembled, the adaptors need not be disassembled and are available directly for future use.

Also, the uncontoured test pins of the invention advantageously need not have portions thereof in which the diameter is smaller than the diameter of the surface required for making contact. As a result, it is the size of this contact surface alone which ultimately determines the stability of the test pins.

Another advantage of the invention is that heads may be provided at the ends of the test pins and that such heads may have any desired shape, which may be the same at both ends. This enables the test pins to be manufactured in a most cost-effective manner.

BRIEF DESCRIPTION OF THE DRAWINGS

Other objects, features and advantages of the invention and embodiments thereof now will be described in detail below, with reference to the accompanying drawings, wherein.

DETAILED DESCRIPTION OF THE INVENTION

Figure 1:
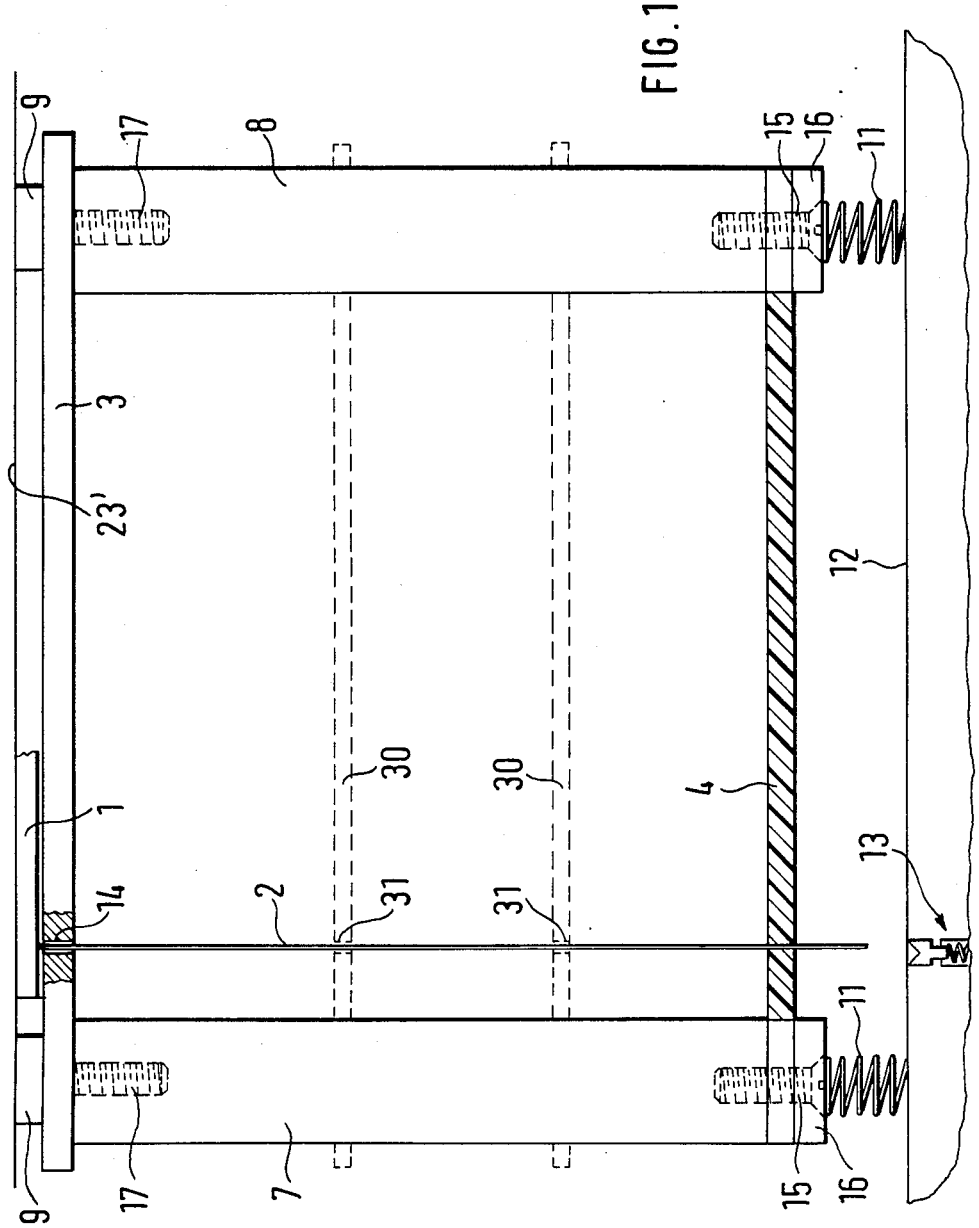
FIGS. 1 to 3 are schematic elevation views, partly in section, of embodiments of the present invention.

Referring now to FIG. 1, there is shown a simplified embodiment of the inventive apparatus for electronically testing printed circuit boards 1 and the like, and which basically includes a mask plate 3, an elastic plate or insert 4 extending parallel with and spaced below mask plate 3, two spacers 7, 8 extending at right angles to the plane of the drawing to maintain mask plate 3 and resilient plate 4 at a desired spacing, test pins 2 extending in a direction normal to the elastic plate 4, preferably resilient means 11 enabling the apparatus to be urged resiliently against an array plate 12 of a grid array, and preferably spacing adaptor elements 9 which are disposed on the surface of mask plate 3 which faces away from elastic plate 4 and which have a thickness slightly greater than the thickness of the circuit board 1 to be tested.

Array plate 12 has mounted therein, at the individual grid points, contact elements 13 which are shown schematically and which yield resiliently in their longitudinal direction. The construction of contact elements 13 is shown in greater detail in FIG. 6. Test pins 2 make connection between given contact elements 13 and given through-contacts or connecting pads of a printed circuit board 1. For simplicity, FIG. 1 shows only a single test pin 2. Test pins 2 extend through through-bores 14 in mask plate 3, which preferably is made of plexiglass. Where the locations of the through-contacts or connecting pads of printed circuit board 1 correspond to the grid of array plate 12, through-bores 14 are aligned with that grid as well. In cases where the locations of the connecting pads or the through-bores in printed circuit board 1 do not agree with the array grid, through-bores 14 are arranged to match the distribution pattern of the through-contacts or connecting pads.

Elastic plate 4, which firmly engages the periphery of the test pins 2 extending therethrough, prevents test pins 2 from dropping from the testing apparatus. Elastic plate 4 is designed to be sufficiently stable while exhibiting the required resilience so that it may be mounted on the apparatus in the manner of a stable plate. The resilience of plate 4 causes the test pins 2 extending therethrough to be retained firmly by the material of plate 4 surrounding the pins by exerting elastic pressure against the peripheral surfaces of the pins. Preferably, elastic plate 4 consists of a relatively stiff elastomeric material, particularly of a suitably reinforced foam material. Plate 4 is held on spacers 7, 8 by fastening means such as elements 15 adapted to threadingly engage spacers 7, 8 and pressure plates 16 which act to urge elastic plate 4 onto the opposite ends of spacers 7, 8. Preferably, mask plate 3 is secured to spacers 7, 8 by threaded fastening elements 17 as well, with the shanks of such threaded elements extending through bores in mask plate 3, and with the head of each threaded element 17 extending beyond the marginal portions of the associated bore and having an axial extent such as to serve as the above-mentioned spacing adaptor element 9.

Resilient means 11 comprise helical coil springs or blocks consisting of a resilient material and may preferably be provided at the ends of spacers 7, 8 adjacent array plate 12. Preferably, at least one such resilient means 11 is provided at each end of each spacer 7, 8, as viewed from a direction perpendicular to the plane of the drawing. The function of the resilient means 11 will be explained in detail below.

The apparatus described above is loaded with test pins 2 by inserting one test pin 2 into a corresponding through-bore 14 in mask plate 3 and through resilient plate 4 for each connection to be made between a contact element 13 on array plate 12 and an associated through-contact or connecting pad on circuit board 1. As previously mentioned, a test pin 2 so inserted will be retained firmly in the apparatus by resilient plate 4 firmly engaging the peripheral surface of the pin so that the test pin cannot drop from the apparatus. To facilitate the proper insertion of specific test pins 2 into elastic plate 4, a template (not shown) may be provided to have openings corresponding to the grid of array plate 12. Such template may be placed on elastic plate 4 for inserting test pins 2 in predetermined positions.

Figure 2:
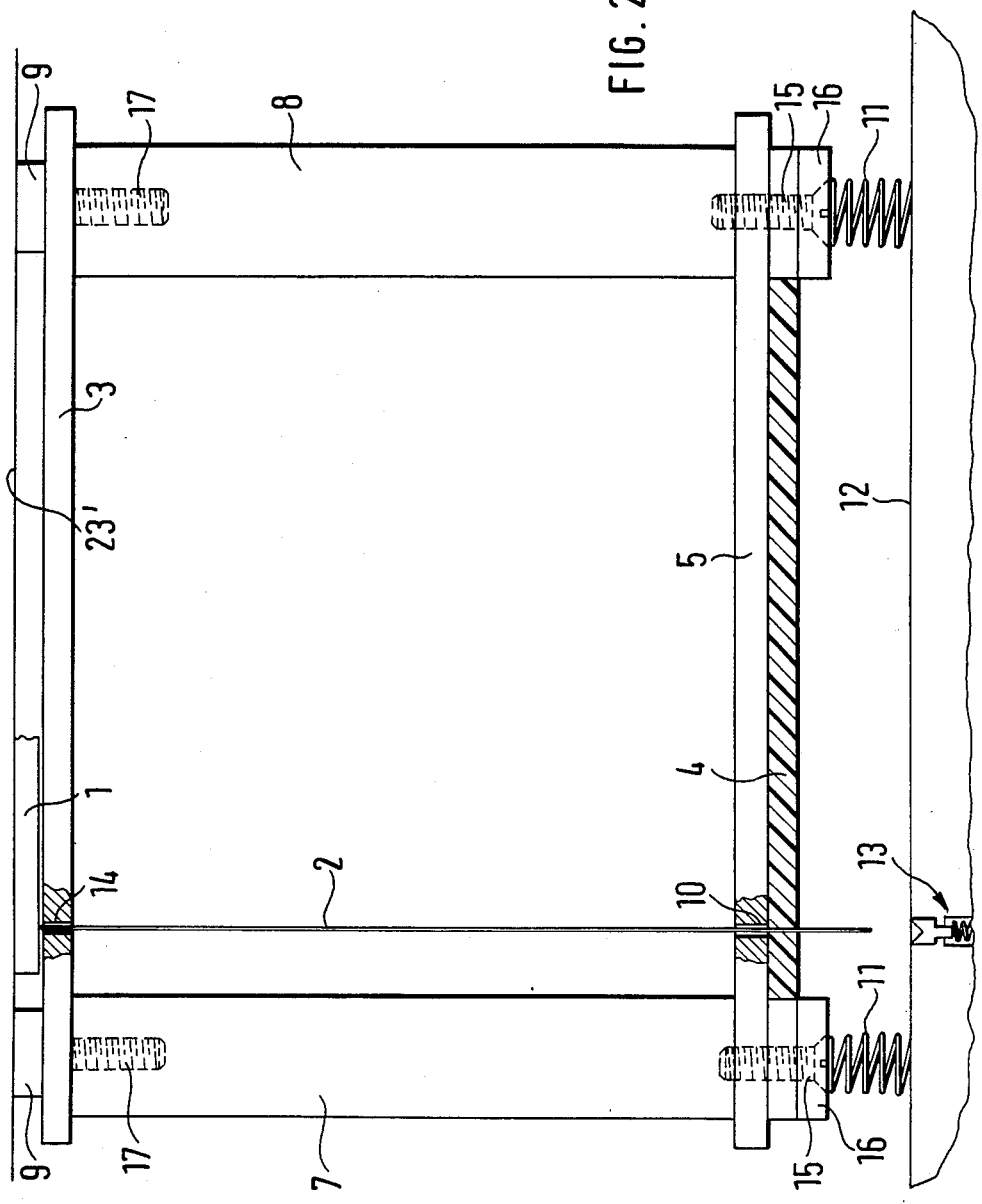

FIG. 2 shows a further development and embodiment of the present invention in which the aforesaid template is replaced by a guide plate 5 mounted on spacers 7, 8 in a position above the parallel to elastic plate or insert 4. Such top guide plate 5 may have through-bores 10 corresponding to the complete grid of array plate 12 for receiving therethrough the individual test pins 2 as the apparatus is loaded. Preferably, the top guide plate 5, of which the openings correspond to the grid pattern, is secured to spacers 7, 8 by means of the threaded fasteners 15 mentioned above in connection with the embodiment of FIG. 1. Also, through-bores 10 may be provided in guide plate 5 to correspond to any portion of the grid, as may be suitable for specific printed circuit boards.

Apparatus of this type which has been loaded with test pins 2 for a specific printed circuit board may be stored for future use by being placed on suitable support means (not shown) in an inverted position so that elastic plate 4 is at the top. Supported this way and retained in elastic plate 4, test pins 2 cannot drop from the apparatus even if elastic plate 4 is not connected firmly with the remainder of the apparatus.

Figure 3:
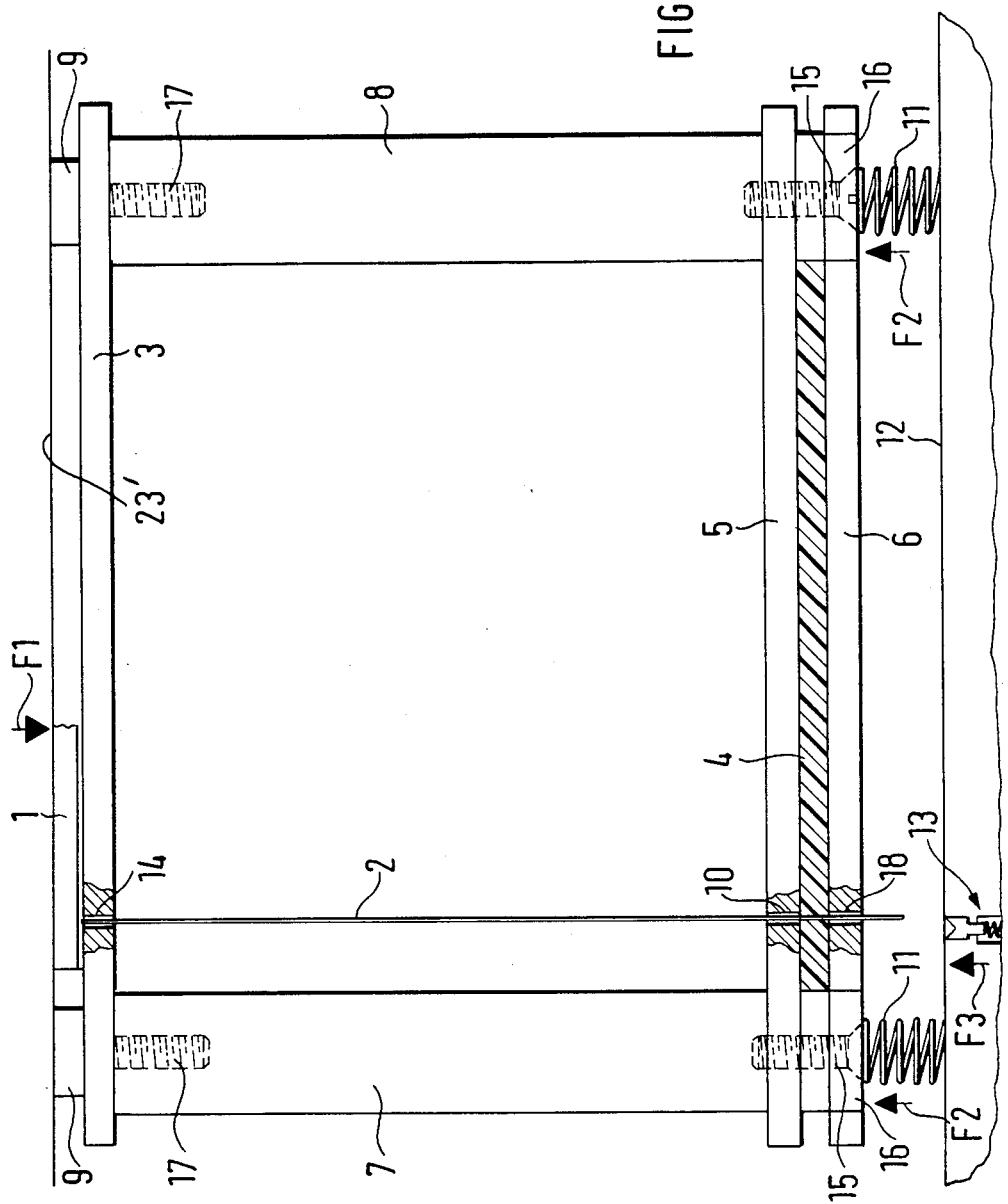

FIG. 3 shows another further development and embodiment of the present invention in which another guide plate 6 is provided below elastic plate or insert 4, with guide plate 6 having through-bores therein according to the aforesaid basic grid pattern and preferably being secured to spacers 7, 8 by means of the previously mentioned fastening elements 15. The through-bores of guide plate 6, which correspond to the complete basic grid of array plate 12 or to any portion of that grid to accommodate a specific circuit board 1, are shown at 18. In this case, elastic insert 4 may be in the form of a plate or sheet loosely placed in the space between top and bottom guide plates 5, 6, both of which are aligned with the predetermined basic array grid. One advantage of this arrangement is that elastic insert 4, being placed loosely between guide plates 5, 6, will accommodate irregularities of circuit board 1, as may be caused by normal manufacturing tolerances, by the individual test pins 2 being displaced axially relative to each other in the area of elastic insert 4 in accordance with such irregularities. Once circuit board 1 has been removed, such displacements will be eliminated by elastic plate 4 returning to its initial condition due to its inherent elasticity.

In the assembly shown in FIG. 3, apparatus loaded with test pins for particular printed circuit board contact configurations may be supported as shown in the drawing as elastic insert 4 is retained in the space between guide plates 5, 6. In case the apparatus is supported with mask plate 3 at the bottom, as described above, guide plate 6 may be removed and used for other purposes.

The individual test pins have no heads and are not specially contoured. Preferably, the pin tips may have the same shape at both ends so that test pins 2 are completely symmetrical. This feature will further reduce the cost of manufacturing the pins. Test pins 2 comprise a resiliently deflectable material, preferably a resiliently deflectable steel spring material.

Figure 4:
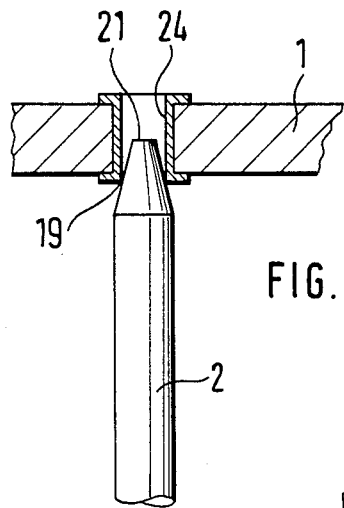
FIG. 4 is an enlarged view showing the tip of a test pin engaging a through-connected bore in a printed circuit board.
Figure 5:
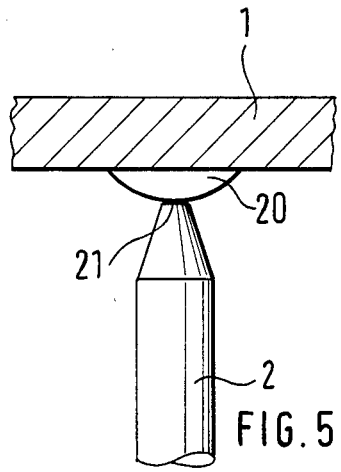
FIG. 5 is an enlarged view showing a test pin tip engaging a connecting pad on a printed circuit board.
Figure 6:
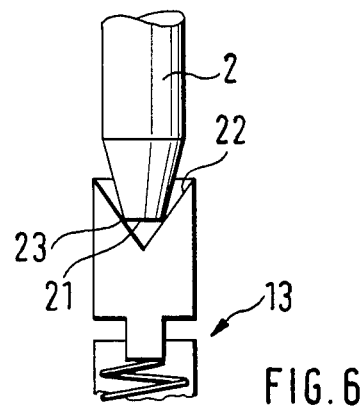
FIG. 6 is an enlarged view showing the tip of a test pin engaging a funnel-shaped opening of a contact element in a grid array.

Preferably, the tips of test pins 2 each are frustoconical in shape, as shown in FIGS. 4 to 6. This shape of the tips of test pins 2 is advantageous for making contact both with through-contacts on printed circuit boards and with connecting pads on SMD circuit boards. As shown in FIG. 4, the tip of each test pin 2 is frustoconical in shape, and contact between such tip and a through contact 24 in a circuit board 1 is made along a peripheral line 19 on the tapered tip. When a frustoconical test pin tip of this type contacts a connecting pad 20, as shown in FIG. 5, end face 21 of the tip engages the surface of connecting pad 20 on printed circuit board 1. As end face 21 exerts surface pressure, the surface finish (gold coating) on connecting pad 20 cannot be destroyed mechanically. If the tip of test pin 2 were not flat, the pressures developed during testing would tend to cause such destruction.

Contact surfaces 22 of the known contact elements 13 in array plate 12 are funnel-shaped, as shown in FIG. 6, and may readily trap dirt caused by the periphery of test pins 2 rubbing along the inner walls of through-bores 18 in lower guide plate 6. If pointed tips were used on test pins 2, the dirt accumulated at the bottom of funnel-shaped contact surface 22 would potentially raise the tip from surface 22, causing contact to be lost. Where the tip has the frustoconical shape described above, contact is ensured even if elements 13 are dirty because edge 23 between flat end face 21 and the tapered portion of the tip causes contact on funnel-shaped surface 22 to be established in an annular fashion, such annular contact being made above the bottom apex of the funnel-shaped surface 22. The edge-type contact along annular edge 23 substantially enhances contact safety compared with the use of pointed tips. As the tips of test pins 2, having frustoconical ends, will not always be introduced into contact elements 13 in a perfectly vertical orientation, the contact region will assume statistically random position on funnel-shaped surfaces 22. As a result, the useful life both of contact elements 13 and of test pins 2 will be increased considerably. Advantageously, the distribution of forces obtained by flattening the end face of the tip end may be controlled by dimensioning such end fact accordingly.

When test pins 2 are made of spring steel, they advantageously exhibit optimum flexibility. After deflection, their resilience will cause them to return to their axial starting positions. Such resilient deflection will occur solely for adaptation to plate or board geometry, allowing connection to be made between contact points in the basic grid of array plate 12 and connecting points or pads on a circuit board 1 which may lie outside the area or pattern of such grid. Also, in the case of localized clusters of connecting points on circuit board 1 which have a density higher than that of the basic grid of array plate 12, compensation is possible by test pins 2 or groups thereof deflecting, such deflection taking place without the test pins changing length.

In order to limit potential deflections of test pins 2, there may be provided on spacers 7, 8 intermediate boards 30 extending at right angles to the axes of test pins 2 and having therethrough bores 31 at locations where the test pins are expected to deflect. Such intermediate plates 30 are shown schematically by broken lines in FIG. 1. In case through bores 14 in mask plate 3 are aligned with the grid of array plate 12, the through-bores in intermediate plates 30 are aligned with that grid as well, whereas, in case through-bores 14 in mask plate 3 are not aligned with the grid of array plate 12, the through-bores in the intermediate plates 30 are staggered so as to arrive at a gradual transition towards the grid of array plate 12.

For the following discussion, it will be assumed that apparatus is provided to position printed circuit board 1 for testing. Such apparatus includes a pressure plate 23' to exert a force F1 (FIG. 3) which will be transmitted directly through spacing adaptor elements 9 to spacers 7, 8. Force F1 is countered by forces F2 exerted by resilient means 11. On the other hand, force F1 is transmitted to circuit board 1 and from the circuit board to test pins 2, with resilient contact elements 13 exerting oppositely directed forces F3 through test pins 2. By the full force F1 of pressure plate 23' acting through adaptor elements 9 both on circuit board 1 and on spacers 7, 8 and any structure connected therewith, test pins 2 will be moved against force F3 of resilient contact elements 13 by the same distance moved by spacers 7, 8 and structure connected therewith. Advantageously, no relative movement can take place between test pins 2 and mask plate 3, intermediate boards 30 and guide plates 5, 6 which might cause material to be removed frictionally from the inner walls of through-bores 14 in mask plate 3, through-bores 31 in intermediate boards 30, if provided (FIG. 1), and through-bores 10, 18 in top and bottom guide plates 5, 6, respectively.

The elastic plate, sheet or insert 4, closely engaging the peripheral surfaces of the test pins, will intercept at the top surface thereof dirt and the like particles which may drop from the printed circuit boards under test through the openings existing in the mask plate 3, the intermediate boards 30 and the top guide plate 5. If elastic plate 4 comprises a hard foam material, it is contemplated to initially provide openings therein for receiving test pins 2.

The contour-less test pins 2 utilized in the present apparatus are suited particularly for use in automatic CAF systems because the absence of any prominent contours renders them readily graspable. CAF (computer aided fixturing) systems operate to determine from drilling data available for individual circuit boards further drilling data for the mask plate and, possibly, for the grid-aligned guide plates. Where automatic test pin loading machines are used, the loading data also may be determined from the drilling data available for each circuit board.

Although the present invention has been described and illustrated with respect to preferred features thereof, it is to be understood that various modifications and changes may be made to the specifically described and illustrated features without departing from the scope of the present invention.

We claim:

1. In an apparatus for electronically testing printed circuit boards, said apparatus including a plurality of substantially parallel test pins for making electrical contacts between contact areas of a printed circuit board being tested and respective of a plurality of resilient contact elements disposed in an array plate in accordance with a grid thereof, and a mask plate extending transversely to said test pins and having through-bores through which extend said test pins, such that when the circuit board being tested is urged toward said array plate the contact areas of the circuit board being tested engage first tip ends of respective said test pins and urge said test pins axially thereof such that second tip ends of said test pins engage respective said resilient contact elements, the improvement comprising:

said test pins being longitudinally rigid, and each said test pin being uncontoured with a substantially uniform configuration longitudinally between said first and second tip ends thereof; and means for retaining said test pins in parallel alignment in said apparatus with said test pins extending through respective said through-bores in said mask plate, said means comprising an elastic plate formed of elastic material and mounted at a position spaced from said mask plate and extending parallel thereto, said test pins extending through said elastic plate in a manner such that said elastic material elastically contacts and grasps said test pins, whereby said test pins are maintained in said alignment due to the elasticity of said material.

2. The improvement claimed in claim 1, wherein said through-bores in said mask plate correspond in position to said grid of said array plate.

3. The improvement claimed in claim 1, wherein said through-bores in said mask plate are arranged out of alignment with a said grid of said array plate.

4. The improvement claimed in claim 1, wherein said test pins are formed of resiliently deflectable spring steel material.

5. The improvement claimed in claim 1, further comprising spacing adaptor elements provided between said mask plate, on a side thereof directed toward the printed circuit board being tested, and a pressure surface urging the printed circuit board against said first tip ends of said test pins, said spacing adaptor elements having a thickness corresponding substantially to the thickness of the printed circuit board, so that the printed circuit board and said test pins as well as said spacing adaptor elements and structure connected therewith are moved equally by a force exerted by said pressure surface.

6. The improvement claimed in claim 5, wherein said mask plate and said elastic plate are supported in spaced relationship by means of spacers, and said spacing adaptor elements are secured to first ends of said spacers.

7. The improvement claimed in claim 6, further comprising resilient means provided at second ends of said spacers, such that said apparatus is urgable against said array plate against a force exerted by said resilient means.

8. The improvement claimed in claim 7, wherein said resilient means comprise coil springs.

9. The improvement claimed in claim 7, wherein said resilient means comprise blocks of an elastic material.

10. The improvement claimed in claim 6, wherein said mask plate is secured to said spacers by bolt means, with a shank of each said bolt means extending through a bore provided in said mask plate and being secured in a said spacer, and said spacing adaptor elements comprising heads of said bolt means.

11. The improvement claimed in claim 1, wherein at least one said tip end of each of said test pins is frustoconical in shape.

12. The improvement claimed in claim 1, further comprising a top guide plate provided on a side of said elastic plate directed toward said mask plate, said top guide plate having through-bores through which extend said test pins, and said through-bores being provided in positions corresponding to at least a preselected portion of said grid of said array plate.

13. The improvement claimed in claim 12, further comprising spacers, said top plate being mounted on said spacers.

14. The improvement claimed in claim 13, wherein said elastic plate is mounted on said spacers.

15. The improvement claimed in claim 12, further comprising a bottom guide plate spaced from said top guide plate and having through-bores through which extend said test pins and which are provided in positions corresponding to at least said preselected portion of said grid of said array plate, and said elastic plate comprises an elastic insert positioned between said top guide plate and said bottom guide plate.

16. The improvement claimed in claim 15, wherein said elastic insert has a thickness smaller than the distance between said top and bottom guide plates.

17. The improvement claimed in claim 2, wherein said elastic plate comprises a web of hard foam material or rubber.

18. The improvement claimed in claim 1, wherein said mask plate is formed of plexiglass.

19. The improvement claimed in claim 1, further comprising at least one intermediate board extending parallel to said mask plate at a position between said mask plate and said elastic plate, said intermediate board having therein through-openings disposed in accordance with said grid of said array plate where a pattern of said through-bores of said mask plate correspond to said grid, or disposed to establish a gradual transition from said grid of said array plate to said through-bores in said mask plate when said mask plate through-bores are not aligned with said grid.

* * * * *